(12) United States Patent
Suzuki et al.

(10) Patent No.: US 11,372,042 B2
(45) Date of Patent: Jun. 28, 2022

(54) SEMICONDUCTOR DEVICE AND BURN-IN TEST METHOD THEREOF

(71) Applicant: RENESAS ELECTRONICS CORPORATION, Tokyo (JP)

(72) Inventors: Koji Suzuki, Tokyo (JP); Masaaki Tanimura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 116 days.

(21) Appl. No.: 17/027,999

(22) Filed: Sep. 22, 2020

(65) Prior Publication Data

US 2021/0123972 A1 Apr. 29, 2021

(30) Foreign Application Priority Data

Oct. 23, 2019 (JP) .............................. JP2019-192994

(51) Int. Cl.
*G01R 31/28* (2006.01)
*G01R 31/3177* (2006.01)
*G01R 31/317* (2006.01)
*G01K 3/08* (2006.01)
*G06F 1/06* (2006.01)
*G01R 31/319* (2006.01)

(52) U.S. Cl.
CPC ........... *G01R 31/2855* (2013.01); *G01K 3/08* (2013.01); *G01R 31/2856* (2013.01); *G01R 31/3177* (2013.01); *G01R 31/31727* (2013.01); *G01R 31/31922* (2013.01); *G06F 1/06* (2013.01)

(58) Field of Classification Search
CPC .............. G01R 19/257; G01R 31/2884; G01R 31/3004; G01R 31/3181; G01R 31/31813
See application file for complete search history.

(56) References Cited

U.S. PATENT DOCUMENTS

2003/0149913 A1* 8/2003 Balachandran ............................. G01R 31/318577 714/30
2012/0062266 A1* 3/2012 Gorti .............. G01R 31/318552 29/25.01

FOREIGN PATENT DOCUMENTS

JP 2009-008625 A 1/2009

* cited by examiner

*Primary Examiner* — Tung X Nguyen
(74) *Attorney, Agent, or Firm* — McDermott Will & Emery LLP

(57) ABSTRACT

A semiconductor device includes a temperature sensor, a scan control circuit which generates scan chain selection information in accordance with a measurement result of the temperature sensor, a clock control circuit which generates one or more scan chain clock signals based on an external clock signal and the scan chain selection information, a pattern generation circuit which generates a test pattern, and a logic circuit which includes a plurality of scan chains and which receives the scan chain clock signals and the test pattern. The clock control circuit generates the scan chain clock signal in association with each scan chain. During a burn-in test, the logic circuit captures the test pattern into the scan chain associated with the scan chain clock signal.

13 Claims, 14 Drawing Sheets

FIG. 11

| SCAN CHAIN SELECTION INFORMATION | CLOCK GATING CONTROL INFORMATION | | | |
|---|---|---|---|---|
| | 1000 | 1010 | 1110 | 1111 |
| 1000 | 111.5°C | 117.2°C | 123.8°C | 130.1°C |
| 1010 | 113.0°C | 118.6°C | 125.1°C | 131.8°C |
| 1110 | 114.4°C | 120.9°C | 126.8°C | 133.3°C |
| 1111 | 115.7°C | 122.3°C | 128.5°C | 134.9°C |

SEMICONDUCTOR DEVICE AND BURN-IN TEST METHOD THEREOF

CROSS-REFERENCE TO RELATED APPLICATIONS

The disclosure of Japanese Patent Application No. 2019-192994 filed on Oct. 23, 2019 including the specification, drawings and abstract is incorporated herein by reference in its entirety.

BACKGROUND

This disclosure relates to a semiconductor device and a burn-in test method of the semiconductor device.

The Background of the Invention

One of test methods of a semiconductor device is a burn-in test (hereinafter referred to as "BI test"). The BI test is a test for performing removal of early defective products and evaluation of stress tolerance to temperature and voltage by operating a semiconductor device for a predetermined period of time with temperature and voltage loads applied. In the BI test, there is a risk of thermal runaway due to the current flowing through a semiconductor device. Therefore, particularly in a semiconductor device that consumes a large amount of current, it is required to appropriately control the temperature of the semiconductor device during the BI test.

There are disclosed techniques listed below.
[Patent Document 1] Japanese Unexamined Patent Application Publication No. 2009-86250001

For example, Patent Document 1 discloses a technique for controlling temperature of a semiconductor device during a BI test by varying a frequency of a clock signal in response to the temperature of the semiconductor device. Specifically, the semiconductor device includes a temperature sensor, a voltage control oscillation circuit, and a user logic circuit. The voltage control oscillation circuit generates a clock signal having a frequency based on the output voltage from the temperature sensor. The generated clock signal is supplied to the user logic circuit as an operating clock signal during the BI test.

SUMMARY

However, in Patent Document 1, it is assumed that the voltage control oscillation circuit is mounted on the semiconductor device. In other words, the technique described in Patent Document 1 cannot be applied to a semiconductor device that operates by receiving a clock signal directly from a BI test apparatus.

Other objects and novel features will be apparent from the description of this specification and the accompanying drawings.

A semiconductor device according to one embodiment includes a temperature sensor, a scan control circuit which generates scan chain selection information in accordance with a measurement result of the temperature sensor, a clock control circuit which generates one or more scan chain clock signals based on an external clock signal and the scan chain selection information, a pattern generation circuit which generates a test pattern, and a logic circuit which includes a plurality of scan chains and which receives the scan chain clock signals and the test pattern. The clock control circuit generates the scan chain clock signal in association with each scan chain. During a burn-in test, the logic circuit captures the test pattern into the scan chain associated with the scan chain clock signal.

According to one embodiment, it is possible to appropriately control the temperature variation during the BI test for each semiconductor device, and a result, it is possible to suppress the occurrence of thermal runaway.

BRIEF DESCRIPTION OF THE DRAWINGS

FIG. 11 is a diagram showing an example of temperature control information.

DETAILED DESCRIPTION

Figure 1:
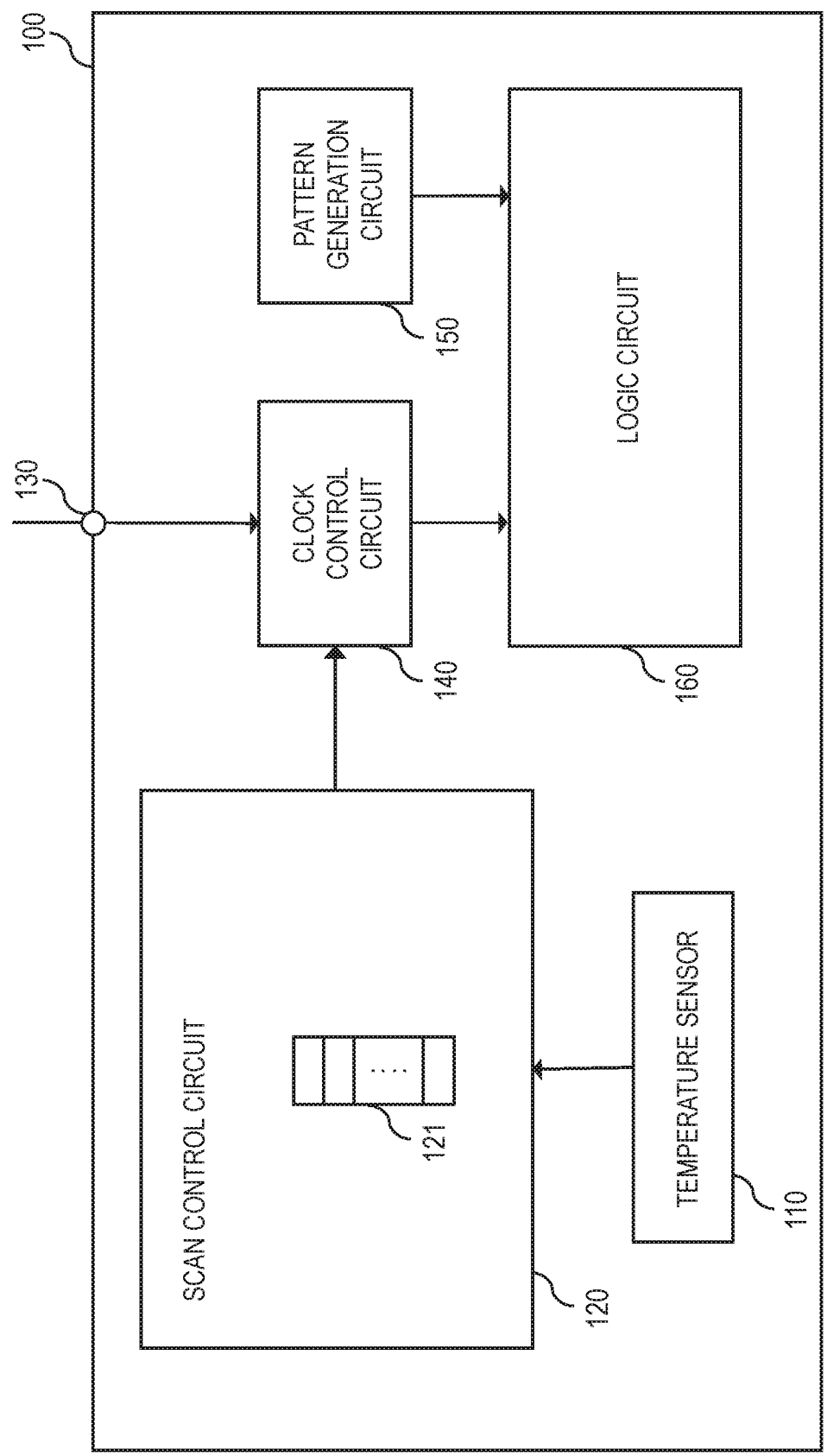
FIG. 1 is a block diagram showing an example of a configuration of a semiconductor device according to a first embodiment.

Hereinafter, embodiments will be described in detail with reference to the drawings. In the specification and the drawings, the same or corresponding components are denoted by the same reference numerals, and a repetitive description thereof is omitted. In the drawings, for convenience of description, the configuration may be omitted or simplified. Also, each of the embodiments may be arbitrarily combined with at least some of the other embodiments.

First Embodiment

FIG. 1 is a block diagram showing an example of a configuration of a semiconductor device 100 according to a first embodiment. As shown in FIG. 1, the semiconductor device 100 includes a temperature sensor 110, a scan control circuit 120, an input terminal 130, a clock control circuit 140, a pattern generation circuit 150 and a logic circuit 160.

The temperature sensor 110 measures the temperature of the semiconductor device 100. The temperature sensor 110 is connected to the scan control circuit 120 and outputs the measurement result of the temperature of the semiconductor device 100 to the scan control circuit 120.

For example, the temperature sensor 110 includes a diode and an analog-to-digital converter (ADC). The diode outputs a forward voltage that varies with the temperature of the semiconductor device 100. The ADC converts the analog value of the forward voltage output from the diode into a digital value. The digital value of the forward voltage, that is, the digital value of the voltage corresponding to the temperature of the semiconductor device 100, is output to the scan control circuit 120.

The scan control circuit 120 includes a scan chain selection register 121. The scan chain selection register 121 stores information for selecting scan chains included in the logic circuit 160 (scan chain selection information). The scan chain selection information is configured by a plurality of bits. The scan chain selection information is changed based on the measurement result of the temperature of the semiconductor device 100 received from the temperature sensor 110. In addition, the scan control circuit 120 is connected to the clock control circuit 140 and outputs the scan chain selection information to the clock control circuit 140.

The Input terminal 130 is a terminal for receiving an external clock signal. The BI test is performed by mounting a BI test board on which a plurality of semiconductor devices 100 are mounted inside the BI test apparatus. While the BI test is running, the BI test apparatus supplies the external clock signal to the input terminal 130. In addition, the input terminal 130 is connected to the clock control circuit 140, and outputs the external clock signal to the clock control circuit 140.

Although only the input terminal 130 is shown as a terminal in FIG. 1, the semiconductor device 100 includes other terminals which are not shown. For example, the semiconductor device 100 includes terminals that receive a power supply voltage, or a ground potential supplied from the BI test apparatus during the BI test.

The clock control circuit 140 generates one or more scan chain clock signals based on the scan chain selection information from the scan control circuit 120 and the external clock signal from the input terminal 130. At this time, the clock control circuit 140 generates a scan chain clock signal in association with each scan chain included in the logic circuit 160. In addition, the clock control circuit 140 is connected to the logic circuit 160 and outputs one or more scan chain clock signals to the logic circuit 160.

The pattern generation circuit 150 generates a test pattern for activating the logic circuit 160 during the BI test. The pattern generation circuit is connected to the logic circuit 160, and outputs the generated test pattern to the logic circuit 160.

The logic circuit 160 is one of the circuits to be tested in the BI test and includes a plurality of scan chains. The logic circuit 160 receives the scan chain clock signal and the test pattern during the BI test. The logic circuit 160 is responsive to the scan chain clock signal to scan in a test pattern to a scan chain associated with the scan chain clock signal. That is, the logic circuit 160 captures the test pattern into the associated scan chain by the scan operation. As a result, a part of the logic circuit 160 which is connected to the scan chain into which the test pattern is captured performs a predetermined operation (BI operation) in accordance with the captured test pattern. On the other hand, a part of the logic circuit 160 which is connected to the scan chain into which the test pattern was not captured does not perform the BI operation.

In this manner, the semiconductor device 100 operates (activates) the logic circuit 160 in accordance with the test pattern captured by the scan operation. After a predetermined BI test operation has been performed, the BI test board is taken out from the BI test apparatus, and it is determined whether an initial failure has occurred in each semiconductor device 100.

Figure 2:
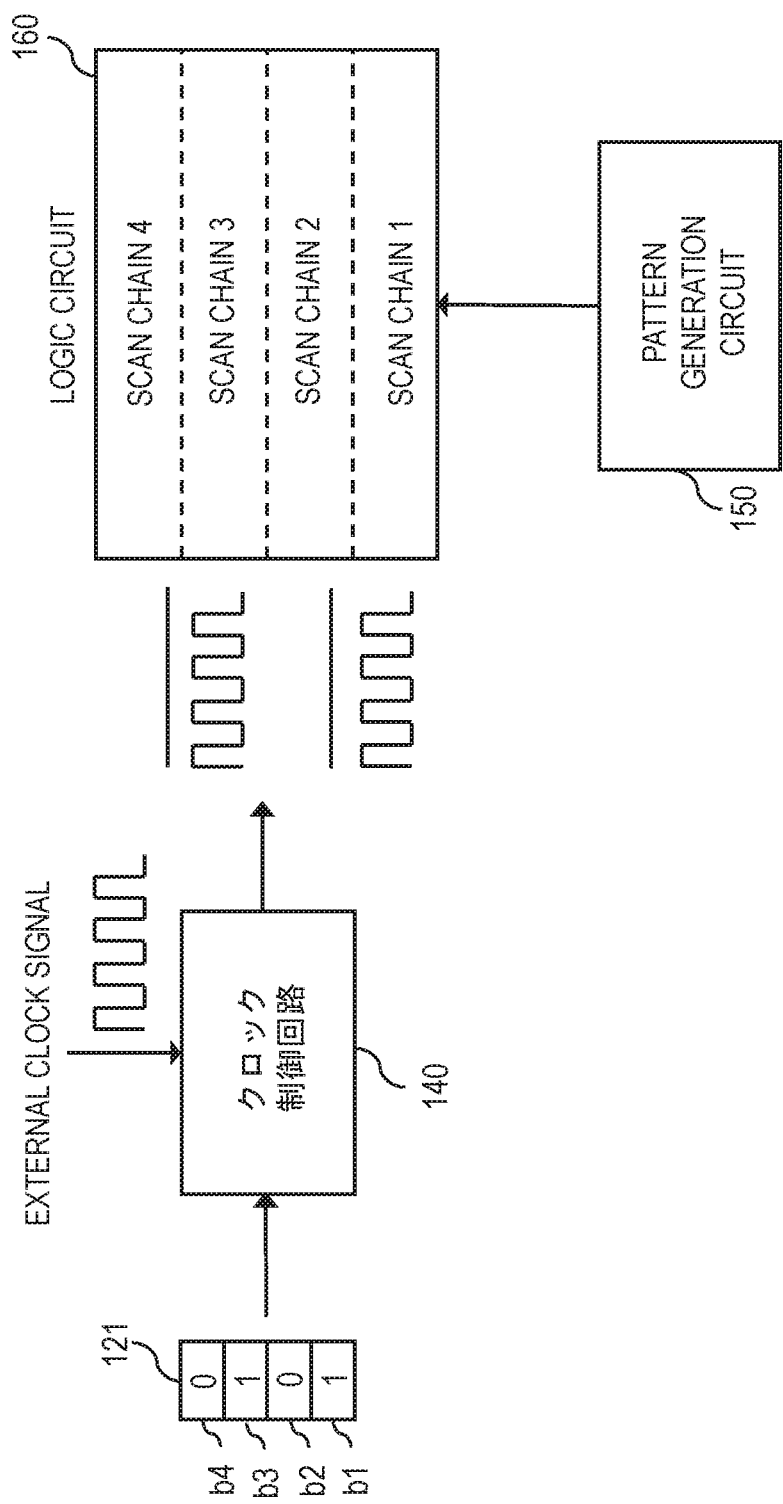
FIG. 2 is a diagram for explaining a scan operation of a scan chain according to the first embodiment.

FIG. 2 is a diagram for explaining the scan operation of the scan chain according to the first embodiment. In FIG. 2, the number of bits of the scan chain selection information held by the scan chain selection register 121 is set to 4, and the number of scan chains included in the logic circuit 160 is exemplified as 4. However, the number of bits of the scan chain selection information and the number of scan chains are not limited to these.

As shown in FIG. 2, the scan chain selection register 121 holds "1010" as 4-bit scan chain selection information (b1, b2, b3, b4). Each bit of the scan chain selection information is associated with any of the scan chains included in the logic circuit 160. For example, in FIG. 2, b1 is associated with a scan chain 1, b2 is associated with a scan chain 2, b3 is associated with a scan chain 3, and b4 is associated with a scan chain 4.

The clock control circuit 140 performs an ON/OFF control for the external clock signal based on the scan chain selection information "1010" held in the scan chain selection register 121. The clock control circuit 140 outputs the scan chain clock signals associated with the scan chains 1-4 by performing the ON/OFF control for the external clock signal.

The clock control circuit 140 performs control to pass the external clock signal (the ON control for the external clock signal) with respect to the bit corresponding to "1" of the 4-bit scan chain selection information (b1 and b3). On the other hand, the clock control circuit 140 performs control not to pass the external clock signal (the OFF control for the external clock signal) with respect to the bit corresponding to "0" of the 4-bit scan chain selection information (b2 and b4).

In this manner, the clock control circuit 140 outputs the external clock signal to each of the scan chains 1 and 3 as the scan chain clock signal. On the other hand, the clock control circuit 140 does not output the external clock signal to each of the scan chains 2 and 4 as the scan chain clock signal. That is, the scan chain clock signal is not supplied to the scan chains 2 and 4.

The scan chains 1 and 3 of the logic circuit 160 receive the scan chain clock signals supplied from the clock control circuit 140 and scan in the test pattern output from the pattern generation circuit 150. On the other hand, since the scan chains 2 and 4 of the logic circuit 160 are not supplied with the scan chain clock signal from the clock control circuit 140, the scan-in of the test pattern is not performed.

In this manner, the scan chains 1 and 3 perform scan operations based on b1 and b3 of the scan chain selection information, and the scan chains 2 and 4 do not perform scan operations based on b2 and b4 of the scan chain selection information. That is, the scan chain in which the scan operation is performed can be switched according to each bit of the scan chain selection information stored in the scan chain selection register 121.

Figure 3:
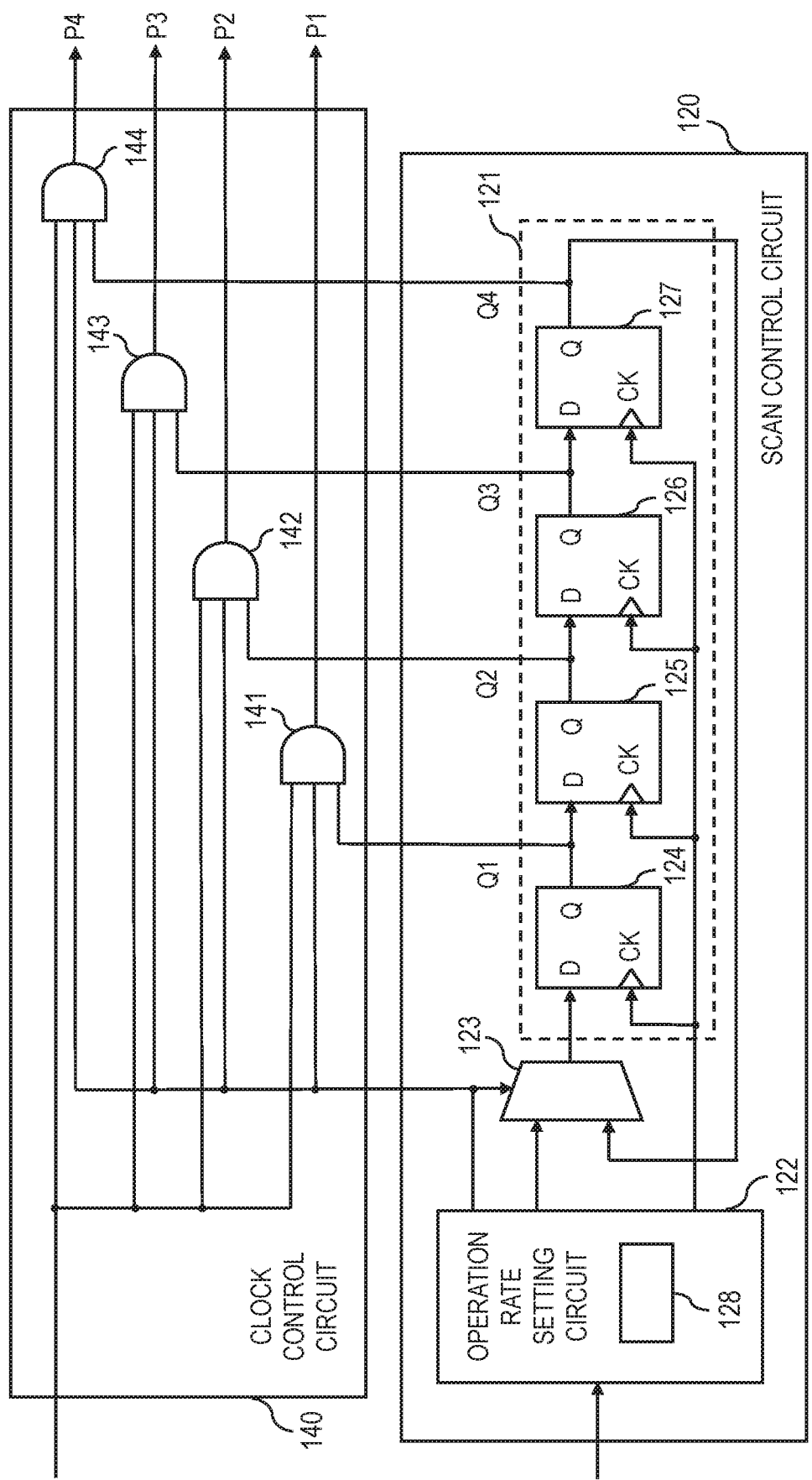
FIG. 3 is a diagram showing an example of a configuration of scan control circuit and a clock control circuit.

FIG. 3 is a diagram showing an example of a configuration of the scan control circuit 120 and the clock control circuit 140. As shown in FIG. 3, the scan control circuit 120 includes the scan chain selection register 121, an operation rate setting circuit 122, and a selection circuit 123.

The operation rate setting circuit 122 is connected to the temperature sensor 110, the scan chain selection register 121, the clock control circuit 140 and the selection circuit 123. Further, the operation rate setting circuit 122 includes a target temperature storage register 128 for storing a target temperature. The target temperature indicates a target value of the temperature of the semiconductor device 100 during the BI test. The operation rate setting circuit 122 generates an operation rate setting signal based on the measurement result of the temperature of the semiconductor device 100 from the temperature sensor 110 and the target temperature stored in the target temperature storage register 128. The generated operation rate setting signal is output to the selection circuit 123.

Further, the operation rate setting circuit 122 outputs a switching signal to the selection circuit 123 and the clock control circuit 140. The switching signal is a signal whose signal level changes when the operation rate setting signal output from the operation rate setting circuit 122 is captured in the scan chain selection register 121. Further, the operation rate setting circuit 122 outputs the shift clock signal to the scan chain selection register 121.

The selection circuit 123 is connected to the operation rate setting circuit 122 and the scan chain selection register 121 and receives the operation rate setting signal and an output signal Q4 of the scan chain selection register 121. The selection circuit 123 selects one of the operation rate setting signal and the output signal Q4 in response to the switching signal from the operation rate setting circuit 122, and outputs the selected signal to the scan chain selection register 121.

The scan chain selection register 121 is configured by a shift register including four D flip-flop circuits (DFFs) 124-127. The scan chain selection information is stored in the shift register. Each of the DFFs 124-127 is supplied with a shift clock signal output from the operation rate setting circuit 122.

The selection circuit 123 is connected to the DFF 124, and any signal of the operation rate setting signal and the output signal Q4 selected by the selection circuit 123 is input to the DFF 124. The signal input to the DFF 124 is captured in the DFF 124 in response to the shift clock signal. The signal captured by the DFF 124 is input to the DFF 125 of the next stage and output to the clock control circuit 140 as an output signal Q1.

Like the DFF 124, each of the DFFs 125-127 captures an output of the DFF of the previous stage in response to the shift clock signal. The captured signals are input to the DFF of the next stage and are output to the clock control circuit 140 as output signals Q2-Q4. However, for the DFF 127, since there is no DFF of the next stage, the output signal Q4 is output to the selection circuit 123.

As described above, the scan chain selection information stored in the scan chain selection register 121 is a signal in which the signal output from the selection circuit 123 is shifted in to the DFFs 124-127, and is output to the clock control circuit 140 as the output signals Q1-Q4 of the DFFs 124-127.

The clock control circuit 140 includes AND circuits 141-144. The external clock signal, the switching signal, and the scan chain selection information (the output signals Q1-Q4) are input to each of the AND circuits 141-144. The AND circuits 141-144 outputs the external clock signal as output signals P1-P4 based on the switch signal and the output signals Q1-Q4.

In detail, for example, the AND circuit 141 outputs the external clock signal as the output signal P1 when the signal level of the switching signal is "1" and the signal level of the output signal Q1 is "1". The AND circuits 142-144 also operate in the same way as the AND circuit 141.

In this manner, the output signals P1-P4 are output as the scan chain clock signals by the respective AND circuits 141-144 performing the ON/OFF control for the external clock signal.

Figure 4:
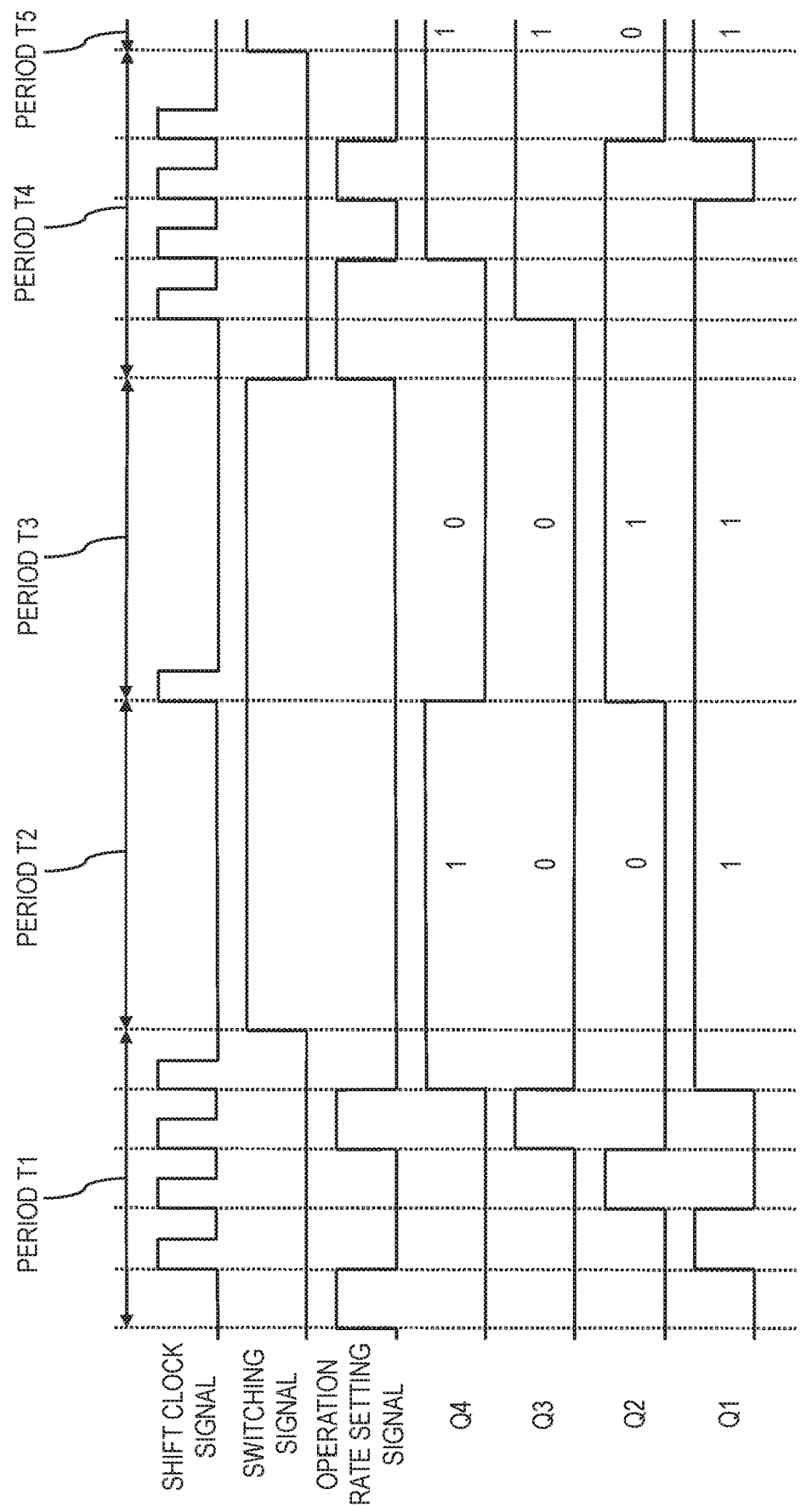
FIG. 4 is a timing chart showing an example of an operation of the scan control circuit.

FIG. 4 is a timing chart showing an example of an operation of the scan control circuit 120 during the BI test. In FIG. 4, a shift operation in the scan chain control register 121 will be mainly described. The lateral direction of FIG. 4 corresponds to time. The vertical direction of FIG. 4 shows the timing at which the shift clock signal, the switching signal, the operation rate setting signal, and the output signals Q1-Q4 change.

As shown in FIG. 4, in the period T1, the operation rate setting circuit 122 outputs the shift clock which includes four pulse signals, and the switching signal whose signal level is "0". Further, the operation rate setting circuit 122 outputs the operation rate setting signal in synchronization with the shift clock signal. In the example shown in FIG. 4, the operation rate setting signal corresponding to "1001" is output serially.

The selection circuit 123 selects the operation rate setting signal ("1001") which is output from the operation rate setting circuit 122 by receiving the switching signal whose signal level is "0", and outputs it to the scan chain selection register 121.

The scan chain selection register 121 shifts in the operating rate setting signal ("1001") to the shift register configured by the DFFs 124-127 in response to the shift clock signal. As a result, the scan chain selection register 121 outputs "1001" to the clock control circuit 140 as the output signals Q1-Q4. That is, the scan chain selection register 121 stores "1001" as the scan chain selection information by the shift operation, and outputs the scan chain selection information to the clock control circuit 140.

Further, at this time, since the switching signal whose signal level is "0" is input to the AND circuits 141-144 in the clock control circuit 140, neither of the AND circuits 141-144 outputs the external clock signal.

In the period T2, the operation rate setting circuit 122 stops the output of the shift clock signal. Therefore, in the scan chain selection register 121, the shift operation is not performed, and there is no change in the output signals Q1-Q4.

Further, the operation rate setting circuit 122 changes the signal level of the switching signal from "0" to "1". In other words, in the period T2, the switching signal whose signal level is "1" is input to the AND circuits 141-144 of the clock control circuit 140.

At this time, the AND circuits 141 and 144 to which the output signals Q1 and Q4 whose signal level is "1" are input output the external clock signal as the output signals P1 and P4, and perform the ON control for the external clock signal. On the other hand, the AND circuits 142 and 143 to which the output signals Q2 and Q3 whose signal level is "0" are input do not output the external clock signal as the output signals P2 and P3, and perform the OFF control for the external clock signal.

In this manner, in the period T2, the output signals P1 and P4 are output as the scan chain clock signals, and the scan chains to which the output signals P1 and P4 are to be input (e.g., scan chains 1 and 4) perform the scan operation. On the other hand, the output signals P2 and P3 are not output as the scan chain clock signals, and the scan chain to which the output signals P2 and P3 are to be input (e.g., scan chains 2 and 3) do not perform the scan operation.

In the period T3, the operation rate setting circuit 122 outputs the shift clock signal including one pulse signal. At this time, the selection circuit 123 receives the switching signal whose signal level is "1" and selects the output signal Q4 from the scan chain selection register 121. That is, the scan chain selection register 121 changes the scan chain selection information (the output signals Q1-Q4) from "1001" to "1100" by performing the shift operation in response to the shift clock signal including one pulse signal.

Depending on the change in the scan chain selection information, the output signals Q1-Q4 also change. Therefore, in the period T3, the AND circuits 141 and 142 to which the output signals Q1 and Q2 whose signal level is "1" are input output the external clock signal as the output signals P1 and P2, and perform the ON control for the external clock signal. On the other hand, the AND circuits 143 and 144 to which the output signals Q3 and Q4 whose signal level is "0" are input do not output the external clock signal as the output signals P3 and P4, and perform the OFF control for the external clock signal.

In this manner, in the period T3, the output signals P1 and P2 are output as the scan chain clock signals, and the scan chains to which the output signals P1 and P2 are to be input (e.g., scan chains 1 and 2) perform the scan operation. On the other hand, the output signals P3 and P4 are not output as the scan chain clock signals, and the scan chains to which the output signals P3 and P4 are to be input (e.g., scan chains 3 and 4) do not perform the scan operation.

Between the periods T2 and T3, the number of "1" included in the scan chain selection information, that is, the number of scan chains performing the scan operation remains two and is not changed. However, between the periods T2 and T3, since the order of "1" and "0" is changed by the shift operation, the scan chain to be the target of the scan operation is changed. In other words, the scan chain associated with the scan chain selection information is changed.

In the period T4, the operation rate setting circuit 122 outputs the shift clock including four pulse signals, and the switching signal whose signal level is "0". Further, the operation rate setting circuit 122 outputs the operation rate setting signal in synchronization with the shift clock signal. In the example shown in FIG. 4, the operation rate setting signal corresponding to "1101" is output serially.

The selection circuit 123 selects the operation rate setting signal ("1101") which is output from the operation rate setting circuit 122 by receiving the switching signal whose signal level is "0", and outputs it to the scan chain selection register 121. The scan chain selection register 121 shifts in "1101", and outputs it to the clock control circuit 140 as the output signals Q1-Q4. At this time, since the switching signal whose signal level is "0" is input to the AND circuits 141-144 of the clock control circuit 140, neither of the AND circuits 141-144 outputs the external clock signal.

In the period T5, when the operation rate setting circuit 122 changes the signal level of the switching signal from "0" to "1", the AND circuits 141, 143 and 144 to which the output signals Q1, Q3 and Q4 whose signal level is "1" are input output the external clock signal as the scan chain clock signal, and perform the ON control for the external clock signal. On the other hand, the AND circuit 142 to which the output signal Q2 whose signal level is "0" is input does not output the external clock signal as the scan chain clock signal, and performs the OFF control for the external clock signal.

In this manner, in the period T5, the scan chains to which the output signals P1, P3 and P4 are to be input (e.g., scan chains 1, 3 and 4) perform the scan operation. On the other hand, the scan chain to which the output signal P2 is input (e.g., the scan chain 2) does not perform the scan operation.

The number of "1" included in the scan chain selection information, that is, the number of scan chains for which the scan operation is performed is two in the periods T2 and T3, but is changed to three in the period T5. In this manner, when the number of scan chains is changed, the scan chain selection register 121 receives a new operation rate setting signal from the operation rate setting circuit 122, and captures the signal by the shift operation, thereby changing the scan chain selection information.

Figure 5:
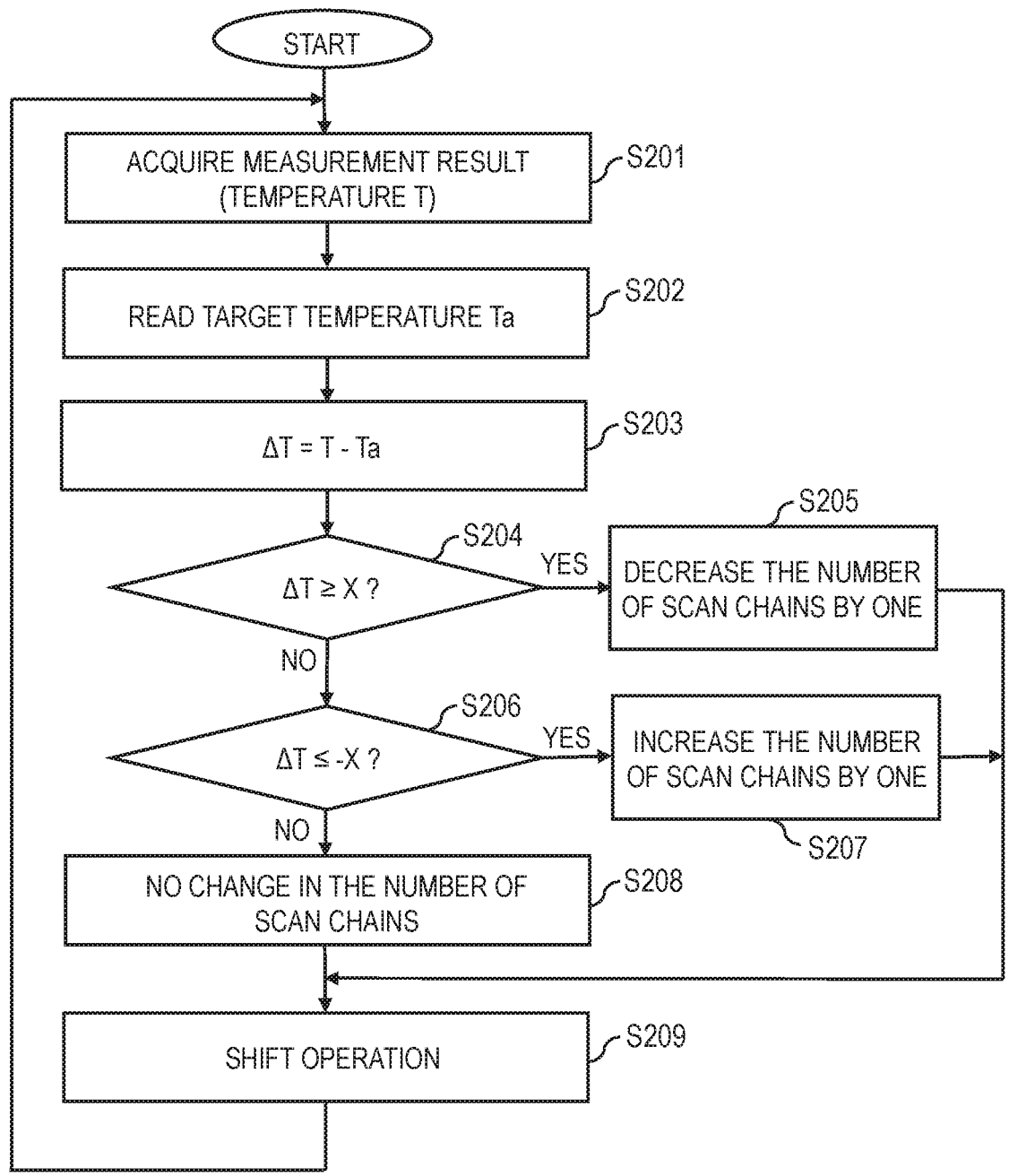
FIG. 5 is a flowchart showing an example of an operation of the semiconductor device according to the first embodiment.

FIG. 5 is a flowchart showing an example of an operation of the semiconductor device 100 according to first embodiment in the BI test method. As shown in FIG. 5, in a step S201, the operation rate setting circuit 122 of the scan control circuit 120 acquires the measurement result of the temperature T of the semiconductor device 100 from the temperature sensor 110.

In a step S202, the operation rate setting circuit 122 reads the target temperature Ta stored in the target temperature storage register 128. The target temperature Ta is the target value of the temperature of the semiconductor device 100 in BI test.

In a step S203, the operation rate setting circuit 122 calculates a difference $\Delta T$ (T−Ta) between the temperature T of the semiconductor device 100 and the target temperature Ta.

In a step S204, the operation rate setting circuit 122 determines whether the difference $\Delta T$ is equal to or greater than X. The value of X indicates the magnitude of the temperature of the semiconductor device 100 that changes as the logic circuit 160 operates in accordance with the test pattern captured into one scan chain during the BI test. Hereinafter, the magnitude of the temperature of the semiconductor device 100 that changes as the logic circuit 160 operates in accordance with the test pattern captured into one scan chain is also referred to as the temperature change amount of one scan chain. The value of X is calculated, for example, by a prior simulation.

If it is determined that the difference $\Delta T$ is equal to or greater than X (YES in the step S204), the process proceeds to a step S205. On the other hand, if it is determined that the difference $\Delta T$ is not equal to or greater than X (NO in the step S204), the process proceeds to a step S206.

In the step S205, the operation rate setting circuit 122 changes the operation rate setting signal so as to decrease the number of scan chains to be performed the scan operation during the BI test by one. That is, since the temperature T of the semiconductor device 100 is equal to or greater than the target temperature Ta plus the temperature change amount (X) of one scan chain, the operation rate setting circuit 122 stops the scan operation of one scan chain. This controls the temperature of the semiconductor device 100 during the BI test not to be too high relative to the target temperature Ta.

In the step S206, the operation rate setting circuit 122 determines whether the difference $\Delta T$ is equal to or less than −X. If it is determined that the difference $\Delta T$ is equal to or less than −X (YES in the step S206), the process proceeds to a step S207. On the other hand, when it is determined that the difference $\Delta T$ is not equal to or less than −X (NO in the step S206), the process proceeds to a step S208.

In the step S207, the operation rate setting circuit 122 changes the operation rate setting signal so as to increase the number of scan chains to be performed the scan operation during the BI test by one. That is, since the temperature T of the semiconductor device 100 is equal to or less than the target temperature Ta minus the temperature change amount (X) of one scan chain, the operation rate setting circuit 122 increases the number of scan chains to be performed the scan operation by one. This controls the temperature of the semiconductor device 100 during the BI test not to be too low relative to the target temperature Ta.

Thus, when the absolute value of the difference ΔT is equal to or greater than the temperature change amount (X) of one scan chain, the operation rate setting circuit 122 changes the operation rate setting signal so as to increase or decrease the number of scan chains to be performed the scan operation by one.

In the step S208, the operation rate setting circuit 122 does not change the operation rate setting signal. If the process proceeds to the step S208, it means that the absolute value of the difference ΔT is within the temperature change of one scan chain. That is, since the temperature T of the semiconductor device 100 is in the vicinity of the target temperature Ta, it is determined that there is no need to change the number of scan chains to be performed the scan operation during the BI test.

In a step S209, the scan chain control register 121 performs the shift operation. When the process passes through the step S205 or the step S207, the scan chain control register 121 captures, by the shift operation, in a new operation rate setting signal as the scan chain control information.

In addition, when the process passes through the step S208, the scan chain control register 121 changes, by the shift operation, the order of "1" and "0" of the held scan chain control information.

After the step S209 is performed, the process returns to the step S201. Thus, if the temperature T of the semiconductor device 100 is higher than the target temperature Ta, the temperature T of the semiconductor device 100 is controlled to gradually approach the target temperature Ta, by determining YES in the step S204 and performing the step S205. On the other hand, if the temperature T of the semiconductor device 100 is lower than the target temperature Ta, the temperature T of the semiconductor device 100 is controlled to gradually approach the target temperature Ta, by determining YES in the step S206 and performing the step S207.

Since it is not able to be anticipated how the current value flowing through the semiconductor device 100 varies, it is preferable that the initial value of the operation rate setting signal be set so that the number of scan chains to be performed the scan operation and the number of scan chains not to be performed the scan operation are about the same number. After the BI test is started using the initial value, based on the flow shown in FIG. 5, the operation rate setting signal is appropriately changed.

Thus, according to the first embodiment, the semiconductor device 100 performs the ON/OFF control for the external clock signal supplied from the BI test apparatus based on the scan chain control information and generates the scan chain clock signals. The semiconductor device 100 may operate the desired scan chains during the BI test using the generated scan chain clock signals. Thus, regardless of whether the voltage control oscillation circuit is mounted, it is possible to appropriately control the temperature variation during the BI test for each semiconductor device, thereby suppressing the generation of thermal runaway. Incidentally, for the semiconductor device mounting the voltage control oscillation circuit, the clock control circuit 140 may generate the scan chain signals based on a clock signal output from the voltage control oscillation circuit instead of the external clock signal.

In addition, the semiconductor device 100 can shift the scan chain control information at predetermined intervals. As a result, it is possible to prevent the region to be activated in the logic circuit 160 during the BI test, i.e., the region in which the BI operation is performed, from becoming uneven.

In the first embodiment described above, the example has been shown in which each bit of the scan chain control information is associated with one scan chain, but the configuration of the first embodiment is not limited to this. It is also possible to simplify control by allowing each bit of the scan chain control information to be associated with a plurality of scan chains.

Modification of First Embodiment

Next, a modification of the first embodiment will be described. In the above-described first embodiment, the operation rate setting circuit 122 performs control to increase or decrease the number of scan chains to be performed the scan operation during the BI test by one in accordance with to the magnitude of the difference ΔT. However, the operation rate setting circuit 122 may simultaneously increase or decrease a plurality of scan chains to be performed the scan operation during the BI test in accordance with the magnitude of the difference ΔT.

Figure 6:
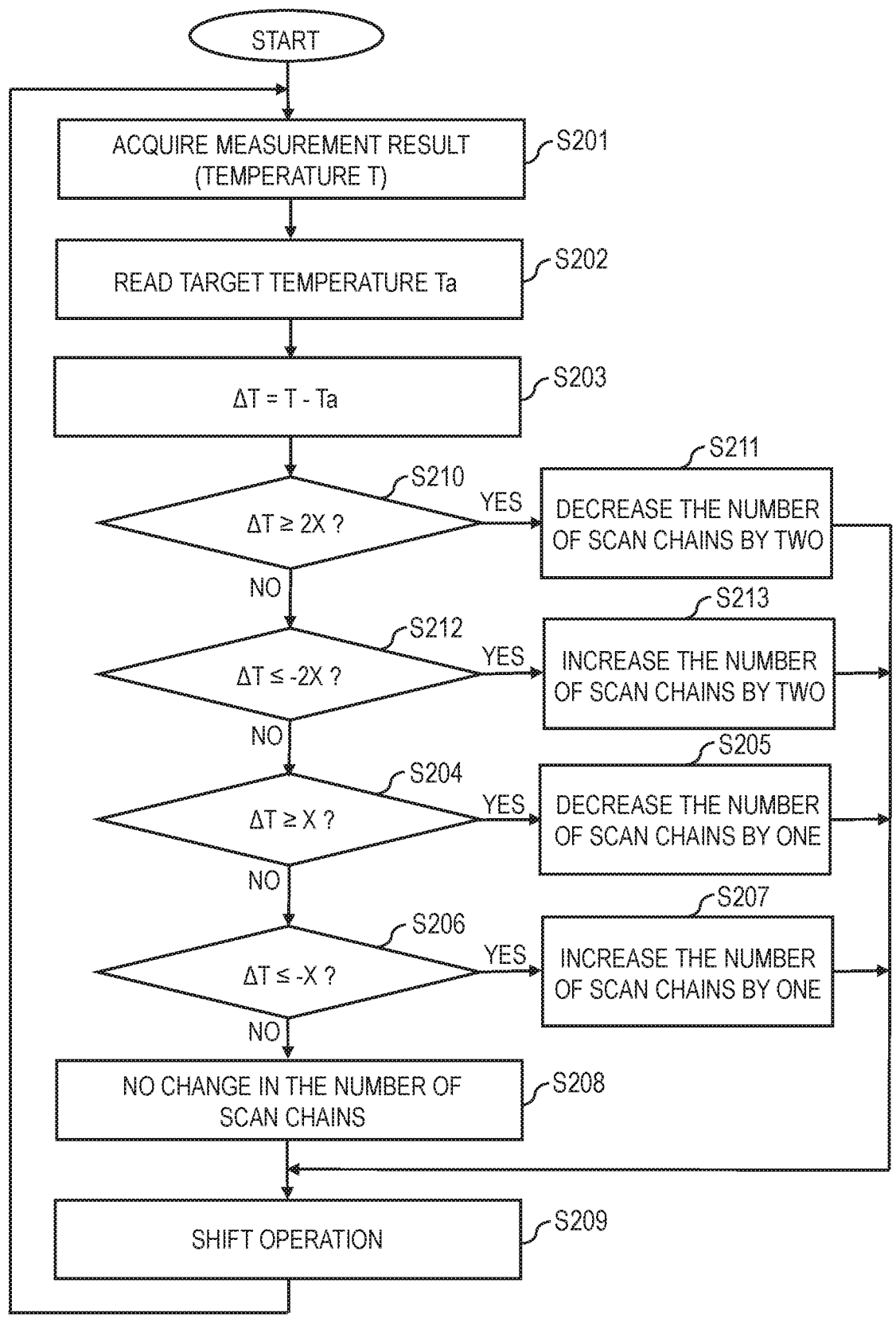
FIG. 6 is a flowchart showing an example of an operation of the semiconductor device according to a modification of the first embodiment.

FIG. 6 is a flowchart showing an example of an operation of the semiconductor device 100 according to the modification of the first embodiment in the BI test method. The same operations (processes) as those in FIG. 5 are denoted by the same reference numerals, and their descriptions are omitted.

As shown in FIG. 6, in a step S210, the operation rate setting circuit 122 determines whether the difference ΔT is equal to or greater than 2X. If it is determined that the difference ΔT is equal to or greater than 2X (YES in the step S210), the process proceeds to a step S211. On the other hand, if it is determined that the difference ΔT is not equal to or greater than 2X (NO in the step S210), the process proceeds to a step S212.

In the step S211, the operation rate setting circuit 122 changes the operation setting signal so as to decrease the number of scan chains to be performed the scan operation during the BI test by two. In other words, since the temperature T of the semiconductor device 100 is equal to or greater than the target temperature Ta plus the temperature change amount (2X) of two scan chains, the operation rate setting circuit 122 decreases the number of scan chains to be performed the scan operation by two.

Thus, if the temperature of the semiconductor device 100 during the BI test is significantly higher than the target temperature Ta, the plurality of scan chains to be performed the scan operation is decreased at a time in accordance with the magnitude of the difference ΔT.

In the step S212, the operation rate setting circuit 122 determines whether the difference ΔT is equal to or less than −2X. If it is determined that the difference ΔT is equal to or less than −2X (YES in the step S212), the process proceeds to a step S213. On the other hand, if it is determined that the difference ΔT is not equal to or less than −2X (NO in the step S212), the process proceeds to a step S204.

In the step S213, the operation rate setting circuit 122 changes the operation setting signal so as to increase the number of scan chains to be performed the shift operation during the BI test by two. In other words, since the temperature T of the semiconductor device 100 is equal to or less than the target temperature Ta minus the temperature change amount (2X) of two scan chains, the operation rate setting circuit 122 increases the number of scan chains to be performed the scan operation by two.

Thus, if the temperature of the semiconductor device 100 during the BI test is significantly lower than the target temperature Ta, the plurality of scan chains to be performed the scan operation is increased at a time in accordance with the magnitude of the difference ΔT.

According to the modification of the first embodiment, when the absolute value of the difference ΔT is large, since the plurality of scan chains to be performed the scan operation is increased or decreased at the same time, as compared with the first embodiment, the temperature T of the semiconductor device 100 can be brought closer to the target temperature Ta earlier.

In the modification of the first embodiment described above, two scan chains are simultaneously increased or decreased, but the configuration of the modification of the first embodiment is not limited to this. It is needless to say that three or more scan chains may be simultaneously increased or decreased.

Second Embodiment

Next, a second embodiment will be described. The semiconductor device 100 according to the first embodiment controls the temperature of the semiconductor device 10 by increasing or decreasing the number of scan chains to be performed the scan operation during the BI test. In contrast, a semiconductor device 300 according to the second embodiment controls the temperature of the semiconductor device 300 by increasing or decreasing the clock pulses of the scan chain clock signal in addition to increasing or decreasing the number of scan chains.

Figure 7:
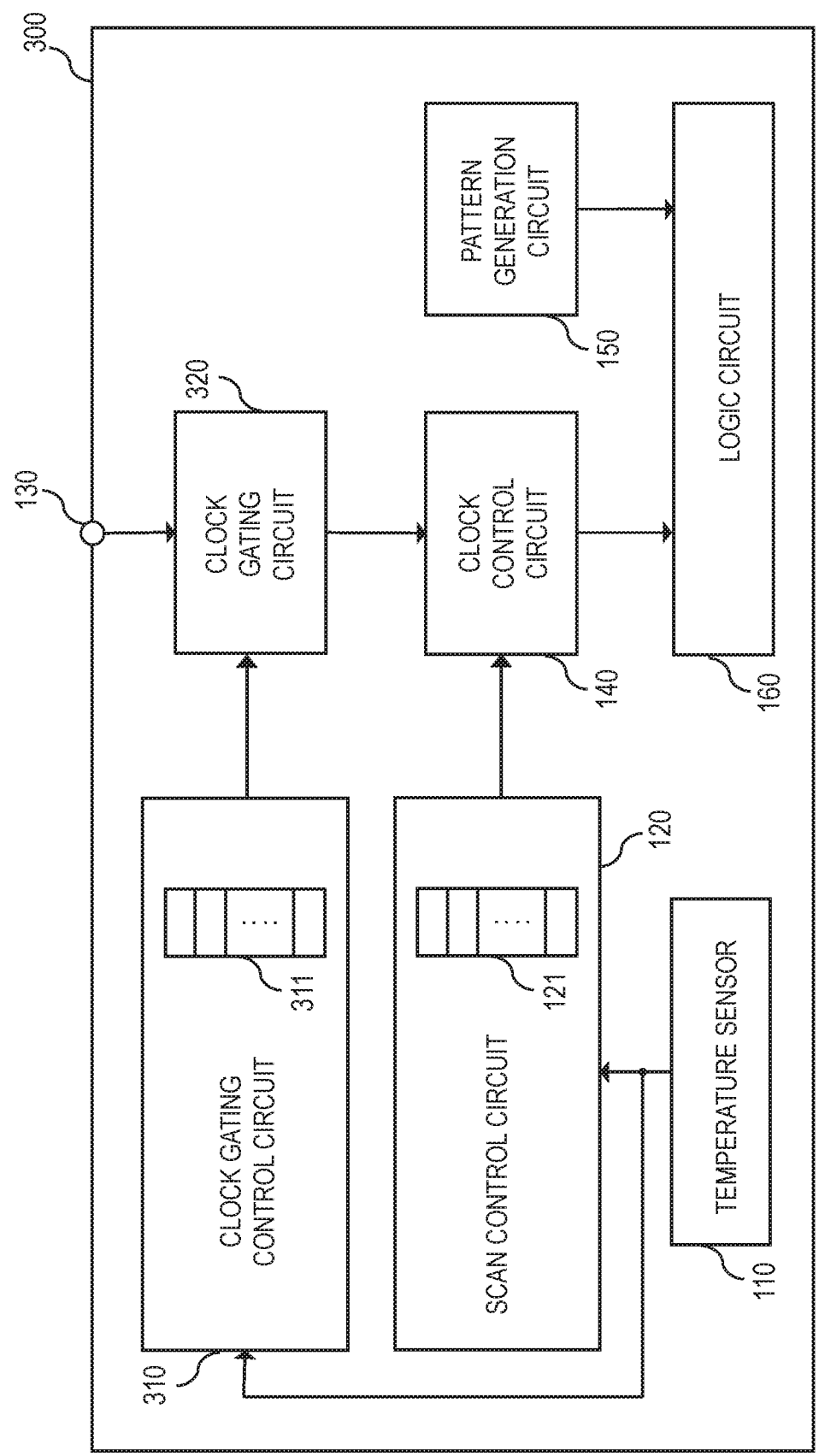
FIG. 7 is a block diagram showing an example of a configuration of a semiconductor device according to a second embodiment.

FIG. 7 is a block diagram showing an example of a configuration of the semiconductor device 300 according to the second embodiment. In FIG. 7, components having the same functions as those in FIG. 1 are denoted by the same reference numerals, and their descriptions are omitted.

As shown in FIG. 7, the semiconductor device 300 includes a clock gating control circuit 310 and a clock gating circuit 320 in addition to the configuration shown in FIG. 1.

The clock gating control circuit 310 has a clock gating control register 311. The clock gating control register 311 stores information (clock gating control information) for controlling the rate of the clock pulse of the external clock signal supplied to the clock control circuit 140. The clock gating control information is changed based on the measurement result of the temperature of the semiconductor device 100 received from the temperature sensor 110. the clock gating control circuit 310 is also connected to the clock gating circuit 320, and outputs the clock gating control information to the clock gating circuit 320.

The clock gating circuit 320 is connected to the input terminal 130 and receives the external clock signal. The clock gating circuit 320, based on the clock gating control information output from the clock gating control circuit 310, adjusts the number of clock pulses included in the external clock signal to be output to the clock control circuit 140.

For example, if the clock gating control information is configured by two bits, the clock gating circuit 320 receives the clock gating control information "00 to adjust the external clock signal to be output to the clock control circuit 140", so as to decrease the number of clock pulses included in the external clock signal to 25%. In this case, the clock gating circuit 320 adjusts the external clock signal by thinning out three of the four clock pulses included in the external clock signal.

Further, the clock gating circuit 320 receives the clock gating control information "01" to adjust the external clock signal to be output to the clock control circuit 140 so as to decrease the number of clock pulses included in the external clock signal to 50%. In this case, the clock gating circuit 320 adjusts the external clock signal by thinning out two of the four clock pulses included in the external clock signal.

The clock gating circuit 320 also receives the clock gating control information "10" to adjust the external clock signal to be output to the clock control circuit 140 so as to decrease the number of clock pulses included in the external clock signal to 75%. In this case, the clock gating circuit 320 adjusts the external clock signal by thinning out one of the four clock pulses included in the external clock signal.

Incidentally, when receiving the clock gating control information "11", the clock gating circuit 320 outputs the external clock to the clock control circuit 140 without adjusting the number of clock pulses included in the external clock signal.

Figure 8:
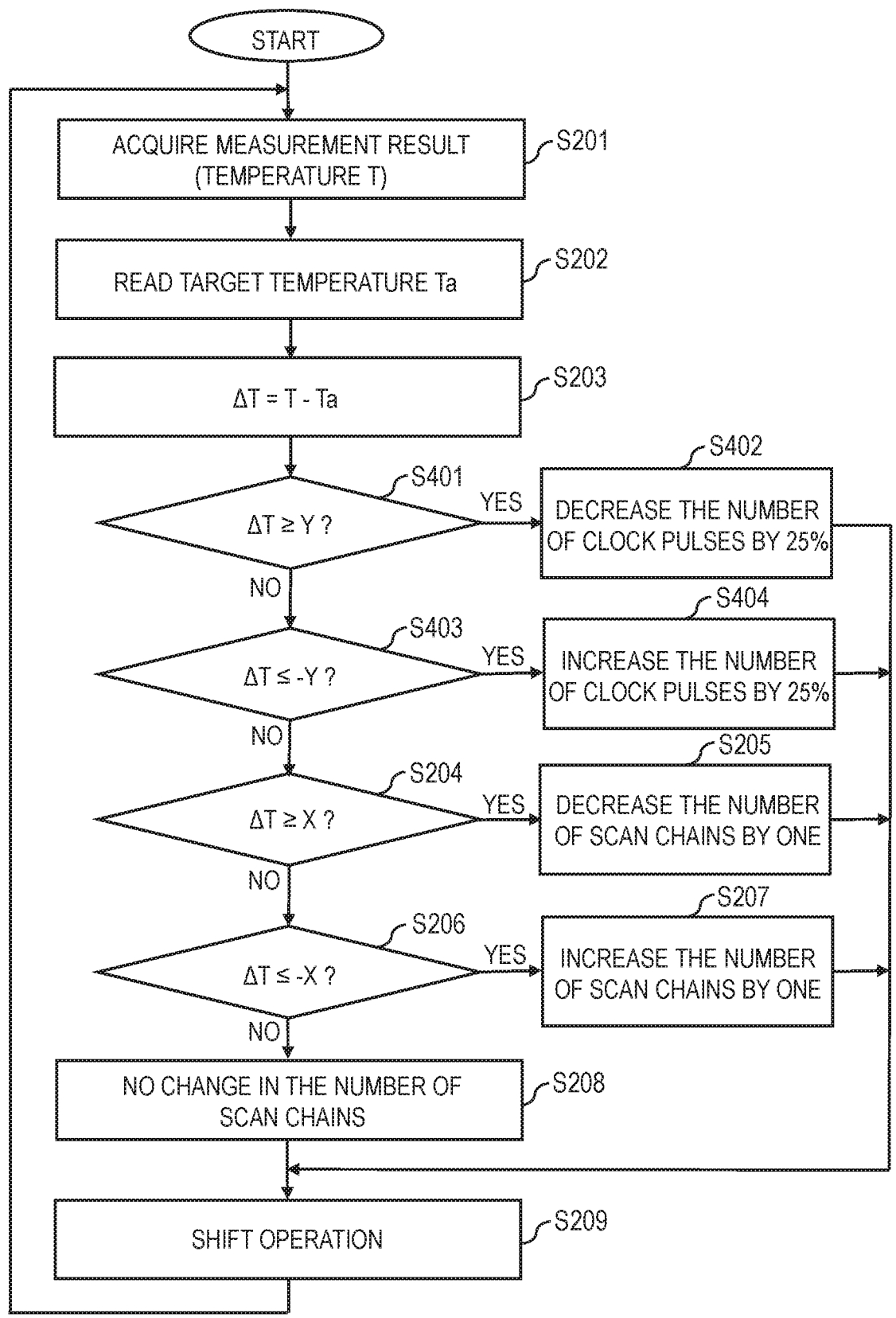
FIG. 8 is a flowchart showing an example of an operation of the semiconductor device according to the second embodiment.

FIG. 8 is a flowchart showing an example of an operation of the semiconductor device 300 according to the second embodiment during the BI test. The same operations (processes) as those in FIG. 5 are denoted by the same reference numerals, and their descriptions are omitted.

As shown in FIG. 8, in a step S401, the clock gating control circuit 310 determines whether the difference ΔT is equal to or greater than Y. The value of Y indicates the magnitude of the temperature of the semiconductor device 300 that changes by increasing the clock pulse of the external clock signal (scan chain clock signal) by 25% during the BI test. The value of Y is calculated, for example, by a prior simulation.

If it is determined that the difference ΔT is equal to or greater than Y (YES in the step S401), the process proceeds to a step S402. On the other hand, if it is determined that the difference ΔT is not equal to or greater than Y (NO in the step S401), the process proceeds to a step S403.

In the step S402, the clock gating control circuit 310 changes the clock gating control information so as to decrease the number of clock pulses included in the external clock signal to be output to the clock control circuit 140 by 25%. The clock gating circuit 320 outputs the external clock signal obtained by reducing the number of clock pulses by 25% to the clock control circuit 140, based on the changed clock gating control information.

In the step S403, the clock gating control circuit 310 determines whether the difference ΔT is equal to or less than −Y. If it is determined that the difference ΔT is equal to or less than −Y (YES in the step S403), the process proceeds to a step S404. On the other hand, if it is determined that the difference ΔT is not equal to or less than −Y (NO in the step S403), the process proceeds to a step S204.

In the step S404, the clock gating control circuit 310 changes the clock gating control information so as to increase the number of clock pulses included in the external clock signal to be output to the clock control circuit 140 by 25%. The clock gating circuit 320 outputs the external clock signal obtained by increasing the number of clock pulses by 25% to the clock control circuit 140, based on the changed clock gating control information.

In the second embodiment, X and Y have the relationship X<Y. For example, if the temperature of the semiconductor device 300 that changes as the logic circuit 160 operates in accordance with the test pattern captured into one scan chain during the BI test is 2° C., the value of X is set to 2° C. Further, if the temperature of the semiconductor device 300 that changes by increasing the clock pulses of the external clock signal (scan chain clock signal) by 25% during the BI test is 8° C., the value of Y is set to 8° C.

Therefore, the semiconductor device 300 first determines whether the absolute value of the difference ΔT is equal to or greater than Y. Here, if the absolute value of the difference ΔT is equal to or greater than Y, the semiconductor device 300 controls, by adjusting the number of clock pulses of the external clock signal (scan chain clock signal), so as to bring the temperature T of the semiconductor device 300 close to the target temperature Ta. The semiconductor device 300 adjusts the number of clock pulses of the external clock signal (scan chain clock signal) until the absolute value of the difference ΔT is not equal to or greater than Y.

After the absolute value of the difference ΔT is not equal to or greater than Y, the semiconductor device 300 determines whether the absolute value of the difference ΔT is equal to or greater than X. Here, if the absolute value of the difference ΔT is equal to or greater than X, the semiconductor device controls, by increasing or decreasing the number of scan chains to be performed the shift operation, so as to bring the temperature T of the semiconductor device 300 close to the target temperature Ta.

Incidentally, since how the current value flowing through the semiconductor device 300 varies cannot be expected, the initial value of the clock gating control information is preferably set to decrease the number of clock pulses included in the external clock signal to 50% or 75%. After the BI test is started using the initial value, the clock gating control information is appropriately changed in accordance with the measurement result of the temperature sensor 110.

Thus, according to the second embodiment, in addition to adjusting the number of scan chains to be performed the shift operation, the semiconductor device 300 can control the temperature variation during the BI test over a wider area than the first embodiment by adjusting the number of clock pulses included in the external clock signal (scan chain clock signal).

For example, when the temperature of the semiconductor device does not fall down to the target temperature even if the number of scan chains to be performed the shift operation is set to the minimum (one), the lower limit of temperature control can be widened by thinning the number of clock pulses included in the external clock signal (scan chain clock signal).

Third Embodiment

Next, a third embodiment will be described. A semiconductor device 500 according to the third embodiment differs from the semiconductor device 300 according to the second embodiment in that the semiconductor device 500 includes a temperature control circuit 510.

Figure 9:
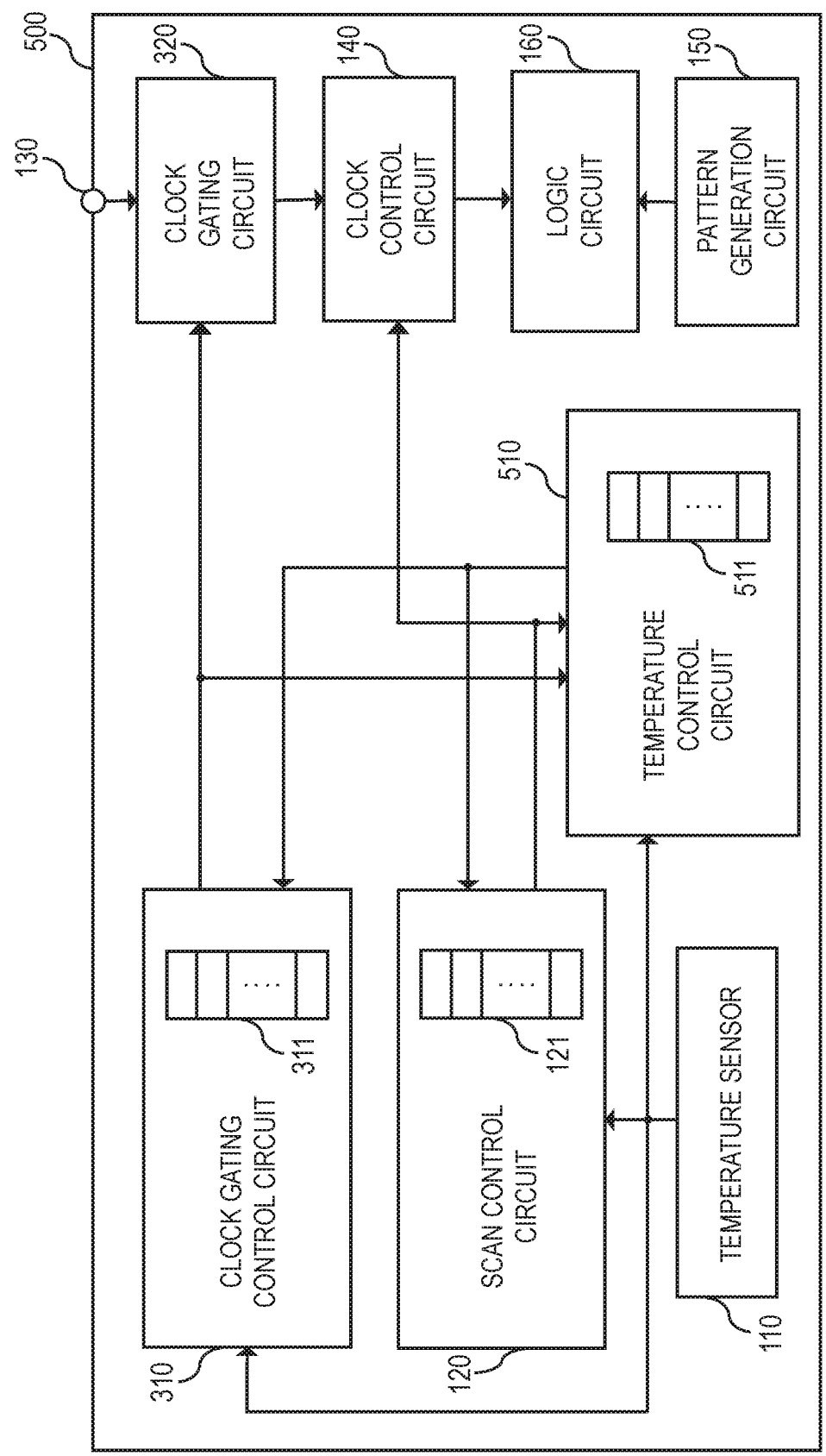
FIG. 9 is a block diagram showing an example of a configuration of a semiconductor device according to a third embodiment.

FIG. 9 is a block diagram showing an example of a configuration of the semiconductor device 500 according to the third embodiment. In FIG. 9, components having the same functions as those in FIGS. 1 and 7 are denoted by the same reference numerals, and their descriptions are omitted.

As shown in FIG. 9, the semiconductor device 500 includes the temperature control circuit 510 in addition to the configuration shown in FIG. 7.

The temperature control circuit 510 has a temperature control information storage unit 511. The temperature control information storage unit 511 stores the measurement result (temperature control information) of the temperature of the semiconductor device 500 when changing the clock gating control information and the scan chain selection information.

The temperature control circuit 510 is connected to the temperature sensor 110, the clock gating control circuit 310 and the scan control circuit 120. The temperature control circuit 510 reads the clock gating control information and the scan chain control information and acquires the measurement result of the temperature of the semiconductor device 500 when reading their information from the temperature sensor 110. The temperature control circuit 510 stores the acquired measurement result in the temperature control information storage unit 511 in association with the clock gating control information and the scan chain control information.

Further, the temperature control circuit 510 reads the target temperature Ta from the target temperature storage register 128. The temperature control circuit 510 refers to the temperature control information storage unit 511 and determines the optimum values of the clock gating control information and the scan chain selection information based on the target temperature Ta.

The optimum values of the clock gating control information and the scan chain selection information are set in the clock gating control register 311 and the scan chain control register 121. The clock gating circuit 320 adjusts the number of clock pulses included in the external clock signal to be output to the clock control circuit 140 in accordance with the optimum value of the clock gating control information. The clock control circuit 140 also generates the scan chain clock signal in accordance with the optimum value of the scan chain selection information.

Figure 10:
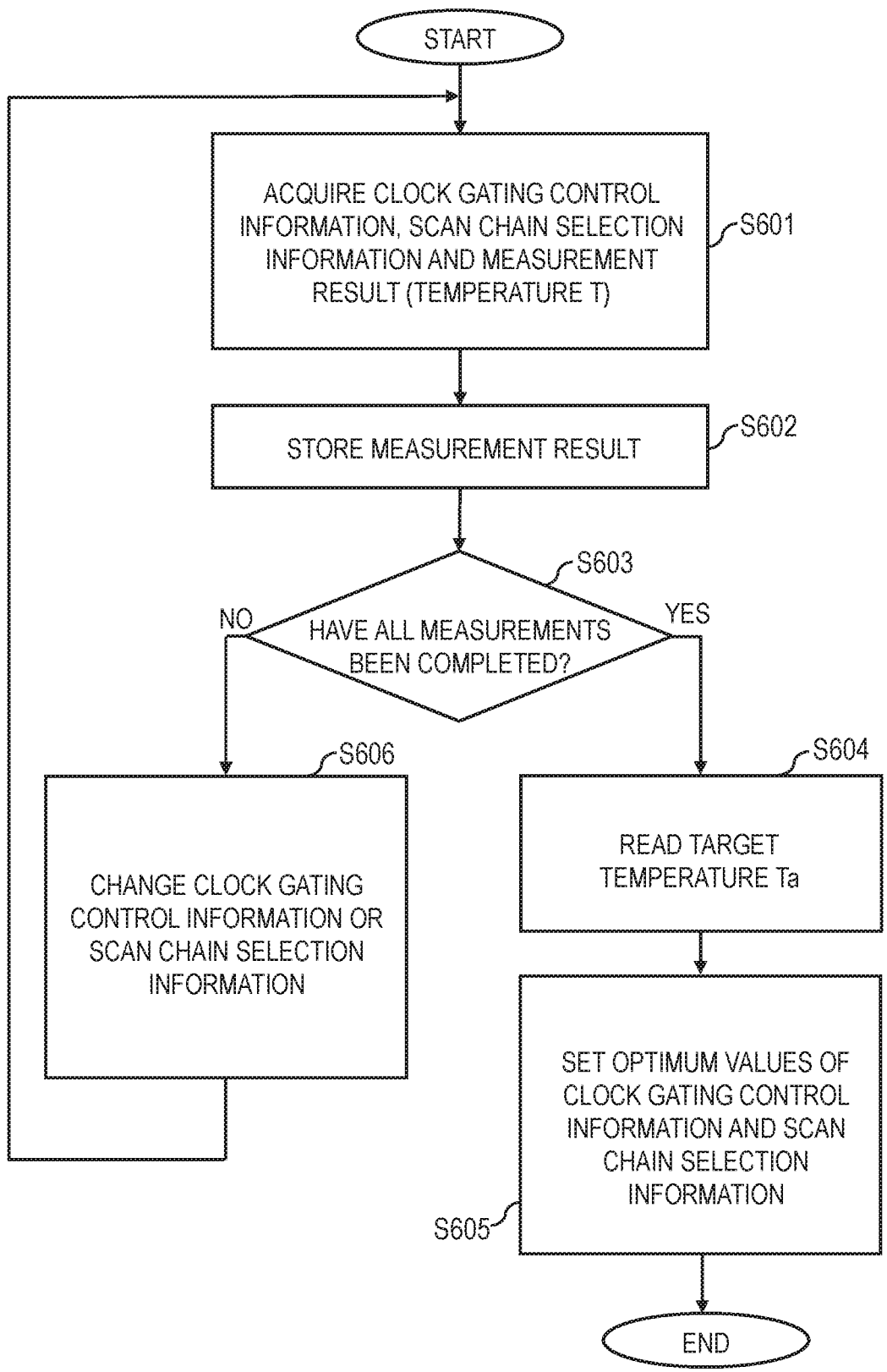
FIG. 10 is a flowchart showing an example of an operation of the semiconductor device according to the third embodiment.

FIG. 10 is a flowchart showing an example of an operation of the semiconductor device 500 according to the third embodiment.

As shown in FIG. 10, in a step S601, the temperature control circuit 510 acquires the clock gating control information from the clock gating control circuit 310, the scan chain selection information from the scan control circuit 120, and the measurement result of the temperature T of the semiconductor device 500 from the temperature sensor 110, respectively. The measurement result acquired from the temperature sensor 110 corresponds to the temperature of the semiconductor device 500 when the BI test operation is performed in accordance with the clock gating control information and the scan chain selection information acquired from the clock gating control circuit 310 and the scan control circuit 120.

In a step S602, the temperature control circuit 510 stores the measurement result of the temperature T of the semiconductor device 500 in the temperature control information storage unit 511 in association with the clock gating control information and the scan chain selection information.

In a step S603, the temperature control circuit 510 confirms whether the measurement of the temperature T of the semiconductor device 500 has been completed in all combinations of clock gating control information and scan chain selection information.

In all combinations of clock gating control information and scan chain selection information, if it is determined that the measurement of the temperature T of the semiconductor device 500 has been completed (Yes in the step S603), the process proceeds to a step S604. On the other hand, in all combinations of clock gating control information and scan chain selection information, if it is not determined that the measurement of the temperature T of the semiconductor device 500 has been completed (NO in the step S603), the process proceeds to a step S606.

In the step S604, the temperature control circuit 510 reads the target temperature Ta stored in the target temperature storage register 128.

In a step S605, the temperature control circuit 510 refers to the temperature control information storage unit 511, and identifies the measurement result close to the target temperature Ta. The temperature control circuit 510 determines the clock gating control information and the scan chain selection information associated with the identified measurement results as optimum values. The temperature control circuit 510 sets the optimum values of the determined clock gating control information and the scan chain selection information to the clock gating control register 311 of the clock gating control circuit 310 and the scan chain selection register 121 of the scan control circuit 120, respectively.

In the step S606, the temperature control circuit 510 controls the clock gating control circuit 310 or the scan control circuit 120 to change either the clock gating control information of the clock gating control register 311 or the scan chain selection information of the scan chain selection register 121. After the step S606 is performed, the process returns to the step S601.

Here, the temperature control information stored in the temperature control information storage unit 511 will be described with reference to FIG. 11. FIG. 11 is a diagram showing an example of the temperature control information. In the example shown in FIG. 11, the clock gating control information may have four values of "1000", "1010", "1110" and "1111". The scan chain selection information may have four values of "1000", "1010", "1110", and "1111".

For example, clock gating control information "1000" indicates that the number of clock pulses of the external clock signal to be supplied to the clock control circuit 140 is decreased by 25%. The clock gating control information "1010" indicates that the number of clock pulses of the external clock signal to be supplied to the clock control circuit 140 is decreased by 50%. The clock gating control information "1110" indicates that the number of clock pulses of the external clock signal to be supplied to the clock control circuit 140 is decreased by 75%. The clock gating control information "1111" indicates that the number of clock pulses of the external clock signal to be supplied to the clock control circuit 140 is not adjusted.

For example, the scan chain selection information "1000" indicates that the number of scan chains to be performed the shift operation is one. The scan chain selection information "1010" indicates that the number of scan chains to be performed the shift operation is two. The scan chain selection information "1110" indicates that the number of scan chains to be performed the shift operation is three. The scan chain selection information "1111" indicates that the number of scan chains to be performed the shift operation is four.

In the example shown in FIG. 11, there are 16 (=4×4) combinations of clock gating control information and scan chain selection information. Therefore, the measurement of the temperature T of the semiconductor device 500 is performed until the temperature measurement is completed in all 16 combinations of clock gating control information and scan chain selection information.

As shown in FIG. 11, the measurement results are stored in the corresponding positions of the row (scan chain selection information) and the column (clock gating control information). As a result, the measurement result is stored in association with the clock gating control information and the scan chain selection information.

In addition, if the target temperature Ta is 125° C., 125.1° C. of the hatched portion is identified as a measurement result close to the target temperature Ta in the example shown in FIG. 11. Therefore, the temperature control circuit 510 determines the clock gating control information "1110" and the scan chain selection information "1010" as the optimum values.

The semiconductor device 500 according to the third embodiment, at the beginning of the BI test operation, measures the temperature of the semiconductor device 500 while changing the clock gating control information and the scan chain selection information, and stores the result in the temperature control information storage unit 511 as the temperature control information. After the temperature control information is stored, the semiconductor device 500 can quickly set the appropriate clock gating information and scan chain selection information by extracting the measurement result close to the target temperature Ta from the temperature control information. As a result, the semiconductor device 500 can early perform the BI test at the appropriate temperature.

In the above-described third embodiment, the temperature T of the semiconductor device 500 is measured in all combinations of clock gating information and scan chain selection information, but the temperature measurements need not be performed in all combinations. Before the temperature measurement is performed, the temperature control circuit 510 acquires the target temperature Ta and may stop the process of performing the temperature measurement when the measurement result exceeds the target temperature Ta during the temperature measurement.

Figure 12:
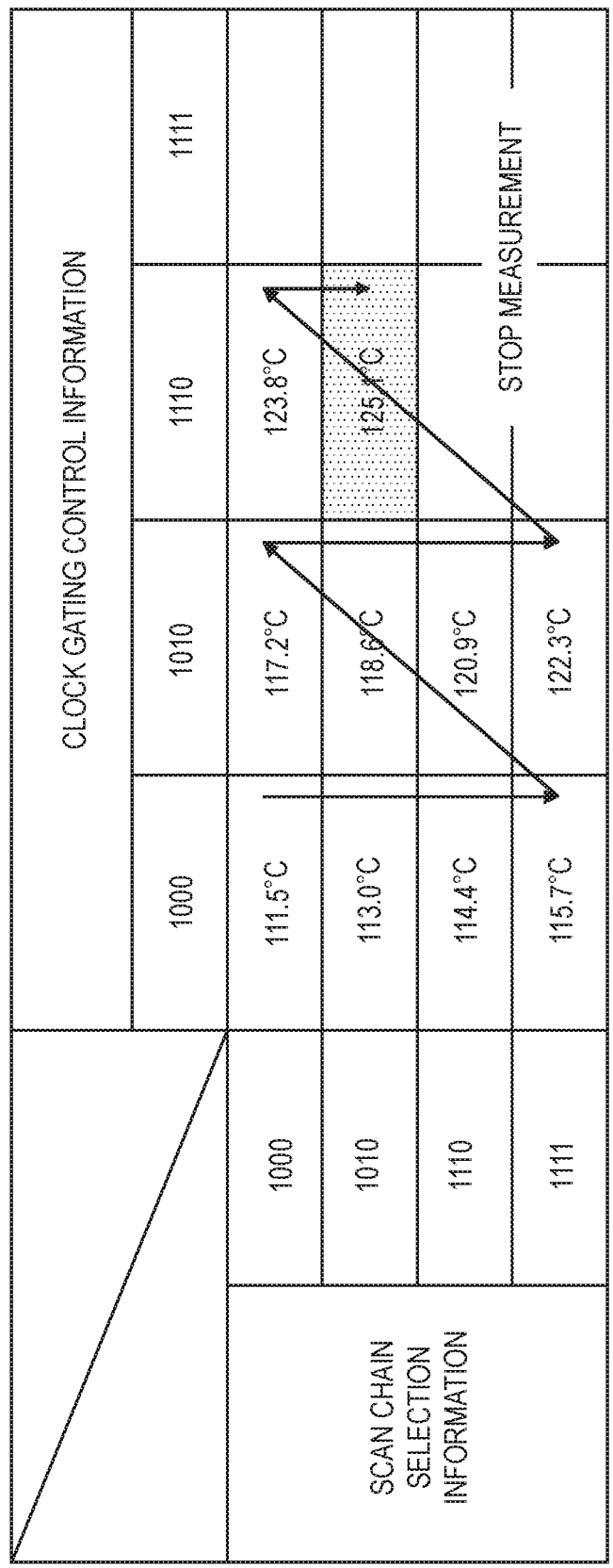
FIG. 12 is a diagram showing another example of the temperature control information.

FIG. 12 is a diagram showing another example of the temperature control information. In the example shown in FIG. 12, the process of the temperature measurement is performed from the clock gating control information "1000" and the scan chain selection information "1000", which are assumed to have low measurement result of the temperature T of the semiconductor device 500. Thereafter, the temperature T of the semiconductor device 500 is measured while changing the clock gating control information and the scan chain selection information in the order of arrows shown in FIG. 11.

In the case of the clock gating control information "1110" and the scan chain selection information "1010", the measurement result of the temperature T of the semiconductor device 500 becomes 125.1° C. and exceeds the target temperature Ta. At this timing, the temperature control circuit 510 determines the clock gating control information "1110" and the scan chain selection information "1010" as the optimum values, where the measurement of the temperature T of semiconductor device 500 is aborted. Therefore, unnecessary temperature measurement processes can be avoided.

Figure 13:
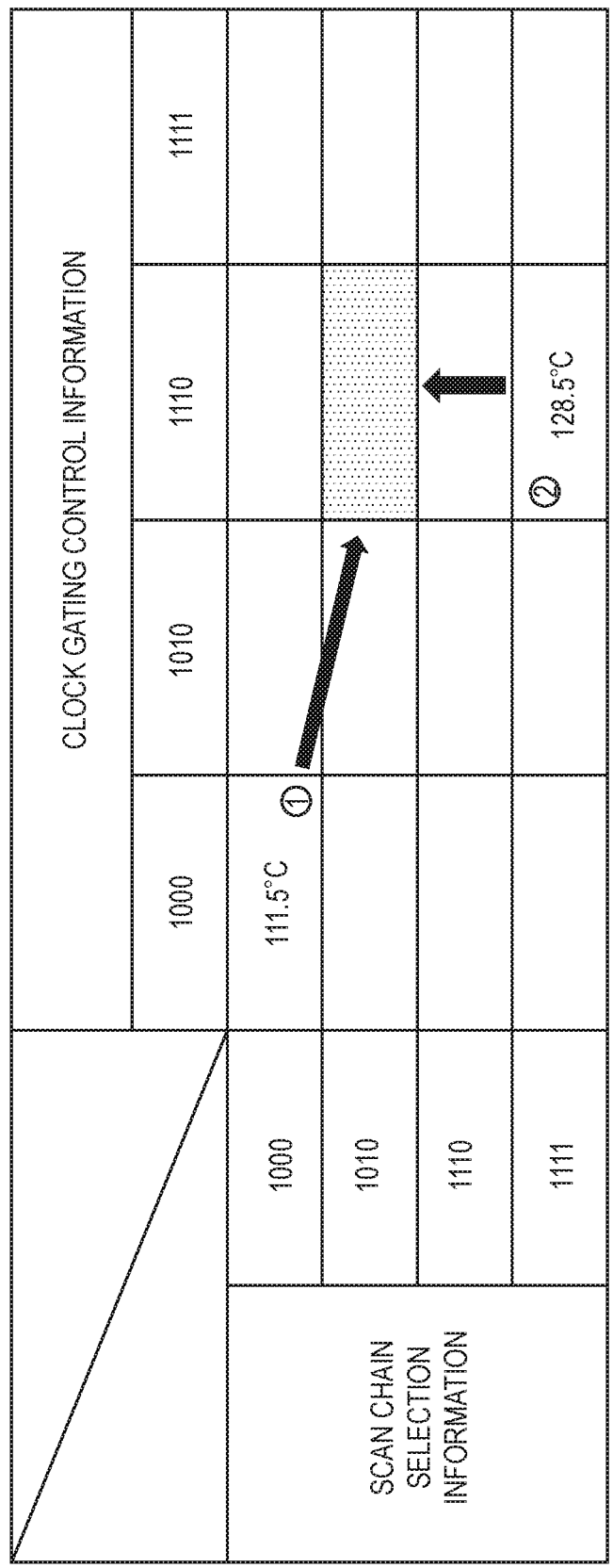
FIG. 13 is a diagram showing still another example of the temperature control information.

FIG. 13 is a diagram showing still another example of the temperature control information. In the example shown in FIG. 13, the first measurement of the temperature T of the semiconductor device 500 is performed at the setting of the clock gating control information "1000" and the scan chain selection information "1000", and as the measurement result, 111.5° C. is obtained. In addition, the second measurement of the temperature T of the semiconductor device 500 is performed at the setting of the clock gating control information "1110" and the scan chain selection information "1111", and as the measurement result, 128.5° C. is obtained.

The temperature control circuit 510 holds temperature variation amount information in each setting, and infers the clock gating control information 1110 and the scan chain selection information "1010" that give the measurement value close to the target temperature Ta based on the two measurement results and the temperature variation amount information. The clock gating control information "1110" and the scan chain selection information "1010" obtained by inferring are determined as the optimum values. Thus, it is possible to further shorten the measurement time of the temperature T of the semiconductor device 500.

Fourth Embodiment

In the above-mentioned first to third embodiments, after the user logic circuit of the semiconductor device is activated during the BI test and a predetermined BI test operation is performed, it is determined whether or not an initial failure has occurred in the semiconductor device. In contrast, there is a method called a monitor BI that performs the BI test while monitoring an output signal from the semiconductor device during the BI test. In the monitor BI, the BI test apparatus compares a signal output from the semiconductor device with an expected value during the BI test operation and judges a semiconductor device whose output signal does not match the expected value as defective.

When the monitor BI is applied to the above-described first embodiment, it is assumed that the semiconductor device 100 merges the output results of each scan chain output from the logic circuit 160 and outputs the merged output results from an output terminal (not shown) to the BI test apparatus. In this case, the BI test apparatus compares the merged output result output from the semiconductor device 100 with the expected value to perform a pass/fail determination.

However, in the semiconductor device 100 according to the first embodiment, since the scan chain into which the test pattern is captured is determined based on the scan chain selection information, the output result of the scan chain into which the test pattern is captured and the output result of the scan chain into which the test pattern is not captured are mixed in the merged output result. Since the expected value held by the BI test apparatus corresponds to the expected value of the output result when the test pattern is captured into all scan chains, the merged output result of the semiconductor device 100 according to the first embodiment differs from the expected value held by the BI test apparatus. Therefore, the monitor BI cannot be applied to the semiconductor device 100 according to the first embodiment. Therefore, in the fourth embodiment, a configuration and operation of a semiconductor device 700 to solve this problem will be described.

Figure 14:
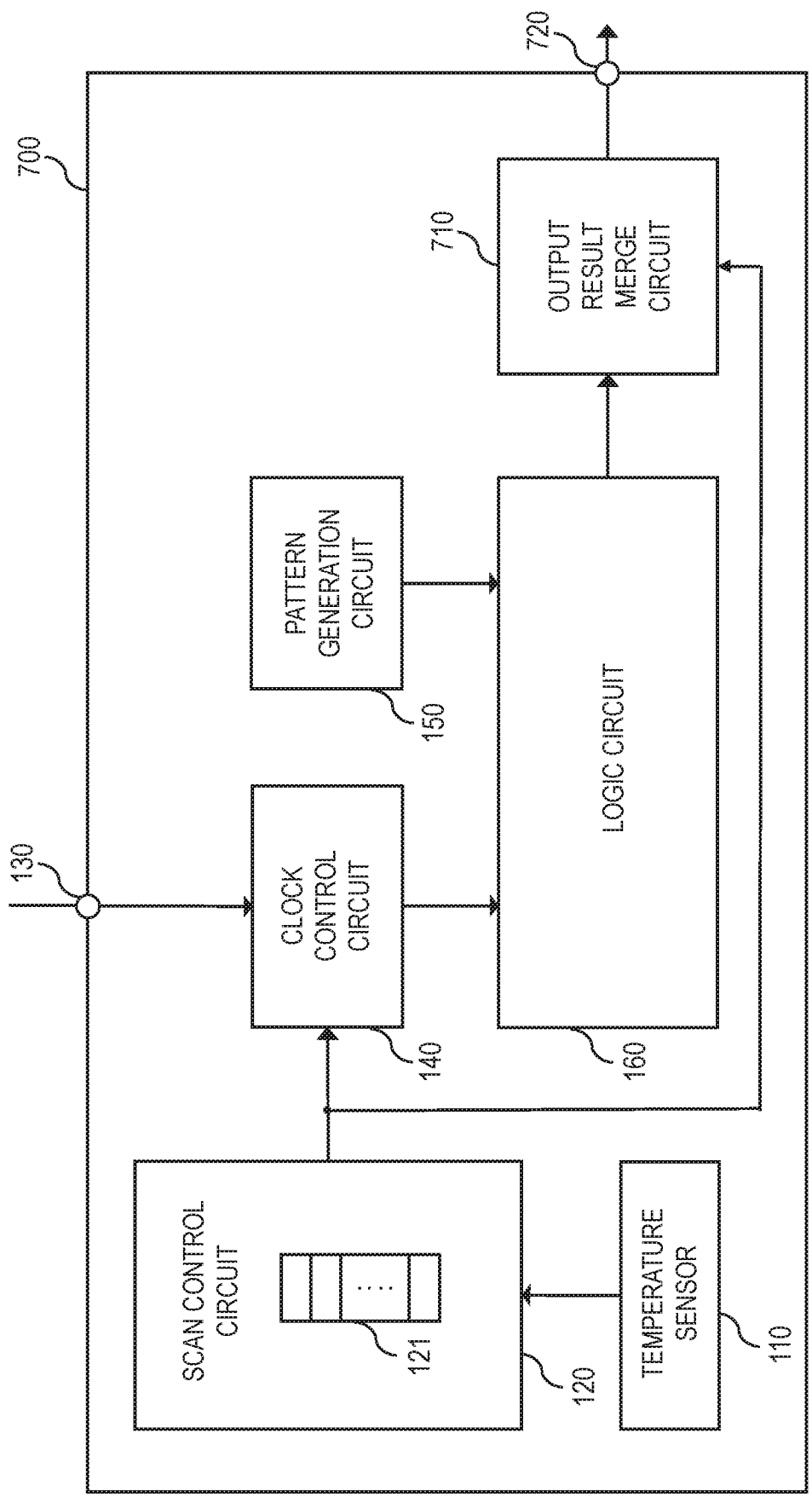
FIG. 14 is a block diagram showing an example of a configuration of a semiconductor device according to a fourth embodiment.

FIG. 14 is a block diagram showing an example of a configuration of the semiconductor device 700 according to the fourth embodiment. In FIG. 14, components having the same functions as those in FIG. 1 are denoted by the same reference numerals, and their description are omitted.

As shown in FIG. 14, the semiconductor device 700 includes an output result merge circuit 710 and an output terminal 720 in addition to the configuration shown in FIG. 1.

The output result merge circuit 710 is connected to the logic circuit 160 and receives the output result of each scan chain of the logic circuit 160. The output result merge circuit 710 is also connected to the scan control circuit 120 and receives the scan chain selection information.

The output result merge circuit 710 identifies the scan chain into which the test pattern is not captured based on the scan chain control information. The output result merge circuit 710 previously holds the output result of each scan chain during normal operation. The output result merge circuit 710 replaces the output result of the scan chain into which the test pattern is not captured with the output result of the scan chain in normal operation.

The output result merge circuit 710 merges the output result of the scan chain into which the test pattern is captured and the replaced output result of the scan chain. The merged output results are output to the BI test apparatus via the output terminal 720.

For example, if four scan chains 1-4 are included in the logic circuit 160 and the test pattern is not captured into the scan chains 1 and 3, the output result merge circuit 710 replaces the output results of the scan chains 1 and 3 with the output results of the scan chains 1 and 3 during normal operation to be held in advance. The output result merge circuit 710 merges the output results of the scan chains 2 and 4, and the replaced output results of the scan chains 1 and 3.

As described above, according to the fourth embodiment, after the output of the scan chain into which the test pattern is not captured is replaced with the output of the scan chain at the time of normal operation, they are merged, and are output to the BI test apparatus. Therefore, even if the number of scan chains activated for the thermal control of the semiconductor device 700 increases or decreases, the expected value determination process in the monitor BI can be appropriately performed.

In the fourth embodiment, the case where the monitor BI is applied to the semiconductor device 100 according to the first embodiment has been illustrated. However, it is of course also feasible to apply the monitor BI to the semiconductor device 300 according to the second embodiment or the semiconductor device 500 according to the third embodiment.

In addition, in the first to fourth embodiments, the configuration and function of the semiconductor device have been described with respect to the block diagrams of FIGS. 1, 7 and 14, but the functions of the blocks of FIGS. 1, 7 and 14 can be implemented not only by circuits (hardware) but also by software. For example, some of the functions of the scan control circuit 120 shown in FIG. 1 can be realized by a Central Processing Unit (CPU) executing a predetermined program. Some of the functions of the clock gating control circuit 310 of FIG. 7, the temperature control circuit 510 of FIG. 9, and the output result merge circuit 710 of FIG. 14 can also be realized by the CPU executing a predetermined program.

Although the invention made by the present inventors has been specifically described based on the embodiments, it is needless to say that the present invention is not limited to the above-described embodiments, and various changes may be made without departing from the scope thereof.

What is claimed is:

1. A semiconductor device comprising:
a temperature sensor configured to measure a temperature of the semiconductor device, and to output a measured temperature as a measurement result;
a scan control circuit configured to generate scan chain selection information in accordance with the measurement result;

a clock control circuit configured to generate one or more scan chain clock signals based on an external clock signal and the scan chain selection information;
a pattern generation circuit configured to generate a test pattern; and
a logic circuit including a plurality of scan chains, and configured to receive the scan chain clock signals and the test pattern,
wherein the clock control circuit is configured to generate the scan chain clock signal in association with each scan chain, and
wherein, during a burn-in test, the logic circuit is configured to capture the test pattern into the scan chain associated with the scan chain clock signal in response to the scan chain clock signal.

2. The semiconductor device according to claim 1, wherein a part of the logic circuit coupled to the scan chain into which the test pattern is captured is configured to perform a predetermined operation in accordance with the test pattern during the burn-in test.

3. The semiconductor device according to claim 1,
wherein the scan control circuit is configured to change the scan chain selection information based on a difference between the measurement result and a target temperature which is a target value of the temperature of the semiconductor device during the burn-in test, and
wherein the clock control circuit is configured to increase or decrease a number of scan chain clock signals in accordance with changed scan chain selection information.

4. The semiconductor device according to claim 3, wherein, when an absolute value of the difference is equal to or higher than the temperature of the semiconductor device which changes by the logic circuit operating in accordance with the test pattern captured into one scan chain during the burn-in test, the scan chain control circuit is configured to change the scan chain selection information so as to increase or decrease the number of scan chain which captures the test pattern by one.

5. The semiconductor device according to claim 1,
wherein the scan control circuit is configured by a shift register, and includes a scan chain selection register storing the scan chain selection information,
wherein the shift register is configured such that an output of the shift register is coupled to an input of the shift register,
wherein the scan chain selection information is configured by a plurality of bits, and
wherein an order of the plurality of bits is changed by a shift operation of the shift register.

6. The semiconductor device according to claim 5, wherein the clock control circuit is configured to change the scan chain associated with the scan chain clock signal in accordance with the scan chain selection information in which the order of the plurality of bits is change.

7. The semiconductor device according to claim 1, further comprising:
a clock gating control circuit configured to generate clock gating control information in accordance with the measurement result; and
a clock gating circuit configured to adjust a number of clock pulses of the external clock signal based on the clock gating control information, and to output the external clock signal with the adjusted number of clock pulses to the clock control circuit.

8. The semiconductor device according to claim 7, further comprising a temperature control circuit including a temperature control information storage unit, and
wherein the temperature control circuit is configured to:
read the clock gating control information and the scan chain selection information form the clock gating control circuit and the scan control circuit;
acquire, from the temperature sensor, the measurement result when the clock gating control information and the scan chain selection information are read;
store, as temperature control information, an acquired measurement result in the temperature control information storage unit in association with read clock gating control information and scan chain selection information; and
determine an optimum value of the clock gating control information and scan chain selection information based on the temperature control information and the target temperature which is the target value of the temperature of the semiconductor device during the burn-in test.

9. The semiconductor device according to claim 1, further comprising an output result merge circuit configured to receive an output result of each scan chain of the logic circuit and the scan chain selection information, and
wherein the output result merge circuit is configured to:
identify, based on the scan chain selection information, a scan chain into which the test pattern is not captured in response to the scan chain clock signal;
replace an output result of an identified scan chain with an output result of the scan chain during a normal operation; and
merge an output result of a scan chain into which the test pattern is captured in response to the scan chain clock signal and a replaced output result.

10. A burn-in test method of a semiconductor device which comprises a logic circuit including a plurality of scan chains, the burn-in test method comprising:
measuring a temperature of the semiconductor device to output a measured temperature as a measurement result;
generating scan chain selection information in accordance with the measurement result;
generating, based on an external clock signal and the scan chain selection signal, one or more scan chain clock signals in association with each scan chain;
generating a test pattern; and
capturing the test pattern in the scan chain associated with the scan chain clock signal in response to the scan chain clock signal.

11. The burn-in test method according to claim 10,
wherein the generating of the scan chain selection information includes changing the scan chain selection information based on a difference between the measurement result and a target temperature which is a target value of the temperature of the semiconductor device during a burn-in test, and
wherein the generating of the scan chain clock signals includes increasing or decreasing a number of scan chain clock signals in accordance with changed scan chain selection information.

12. The burn-in test method according to claim 10,
wherein the scan chain selection information is configured by a plurality of bits,
wherein the generating of the scan chain selection information includes changing an order of the plurality of bits of the scan chain selection information, and wherein the generating of the scan chain clock signals includes changing the scan chain associated with the scan chain clock signal in accordance with the scan chain selection information in which the order of the plurality of bits is change.

13. The burn-in test method according to claim 10, further comprising:
generating clock gating control information in accordance with the measurement result; and
adjusting a number of clock pulses of the external clock signal,
wherein the generating of the scan chain clock signals includes generating, based on the external clock signal with the adjusted number of clock pulses and the scan chain selection signal, the one or more scan chain clock signals in association with each scan chain.

* * * * *